(12) United States Patent
Liu et al.

(10) Patent No.: US 7,385,423 B1
(45) Date of Patent: Jun. 10, 2008

(54) LOW-POWER LOW-VOLTAGE BUFFER WITH HALF-LATCH

(75) Inventors: Lin-Shih Liu, Fremont, CA (US); Mark T Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 188 days.

(21) Appl. No.: 11/114,827

(22) Filed: Apr. 26, 2005

(51) Int. Cl.
  *H03K 19/094* (2006.01)
  *H03K 19/0175* (2006.01)
(52) U.S. Cl. ............... 326/68; 326/83; 327/333
(58) Field of Classification Search ............ 326/63, 326/68, 70, 71, 83, 112; 327/333
See application file for complete search history.

(56) References Cited

U.S. PATENT DOCUMENTS

| | | | | |
|---|---|---|---|---|
| 4,080,539 A | * | 3/1978 | Stewart | 326/81 |
| 4,490,633 A | * | 12/1984 | Noufer et al. | 326/71 |
| 4,926,070 A | * | 5/1990 | Tanaka et al. | 326/81 |
| 6,265,896 B1 | * | 7/2001 | Podlesny et al. | 326/80 |

* cited by examiner

*Primary Examiner*—Daniel Chang
(74) *Attorney, Agent, or Firm*—Ropes & Gray LLP

(57) ABSTRACT

A low-power low-voltage buffer with a half-latch is provided. The half-latch buffer design may provide increased speed without dramatically increasing power consumption.

17 Claims, 4 Drawing Sheets

LOW-POWER LOW-VOLTAGE BUFFER WITH HALF-LATCH

BACKGROUND OF THE INVENTION

This invention relates to a low-power low-voltage buffer with a half-latch. More particularly, this invention relates to a half-latch low-voltage buffer design that may provide increased speed without dramatically increasing power consumption.

Typical buffer designs consist of an NMOS passgate, two inverters, and a half-latch. The NMOS passgate serves as a switch to selectably pass or block voltage from the inverters. Typical NMOS passgates may not be able to pass full voltage levels. A typical NMOS passgate may reduce the passed voltage level by an amount approximately equal to the threshold voltage ($V_T$) of the transistor. The half-latch, in response to the output of one of the inverters, may pull up the output of the NMOS passgate to the full voltage level.

When operated with high voltage levels, the voltage reduction of the NMOS passgate may not significantly affect the performance of the buffer. However, when operated with lower voltage levels, the voltage reduction of the NMOS passgate may slow down or prevent the buffer from passing the input signal.

One approach used to increase the speed of low-voltage buffer circuits is to reduce the threshold voltage of the NMOS passgates. This minimizes the reduction in the voltage level by the passgate and increases the speed of the buffer. One drawback to using lower threshold voltage NMOS passgates is increased leakage currents. The lower the threshold voltage of the NMOS passgates, the greater the leakage current passing through the passgates. The greater the leakage currents passing through the passgates, the higher the power consumption of the buffer circuit. Thus, when adjusting the threshold voltage of the NMOS passgates there is a tradeoff between increased speed and increased power consumption.

SUMMARY OF THE INVENTION

In view of the foregoing, a low-power, low-voltage buffer with a half-latch is provided. This buffer design may provide increased speed at low voltages without dramatically increasing power consumption.

According to an embodiment of the present invention, a low-threshold NMOS transistor and a PMOS transistor are added to the buffer design. The PMOS transistor may isolate feedback from the inverter to the half-latch and may allow the low-threshold NMOS transistor to turn on the half-latch at a low trip point. This may help the inverter to switch faster, thereby increasing the overall speed of the buffer.

Further features of the invention, its nature and various advantages, will be more apparent from the accompanying drawings and the following detailed description.

DETAILED DESCRIPTION

Figure 1:
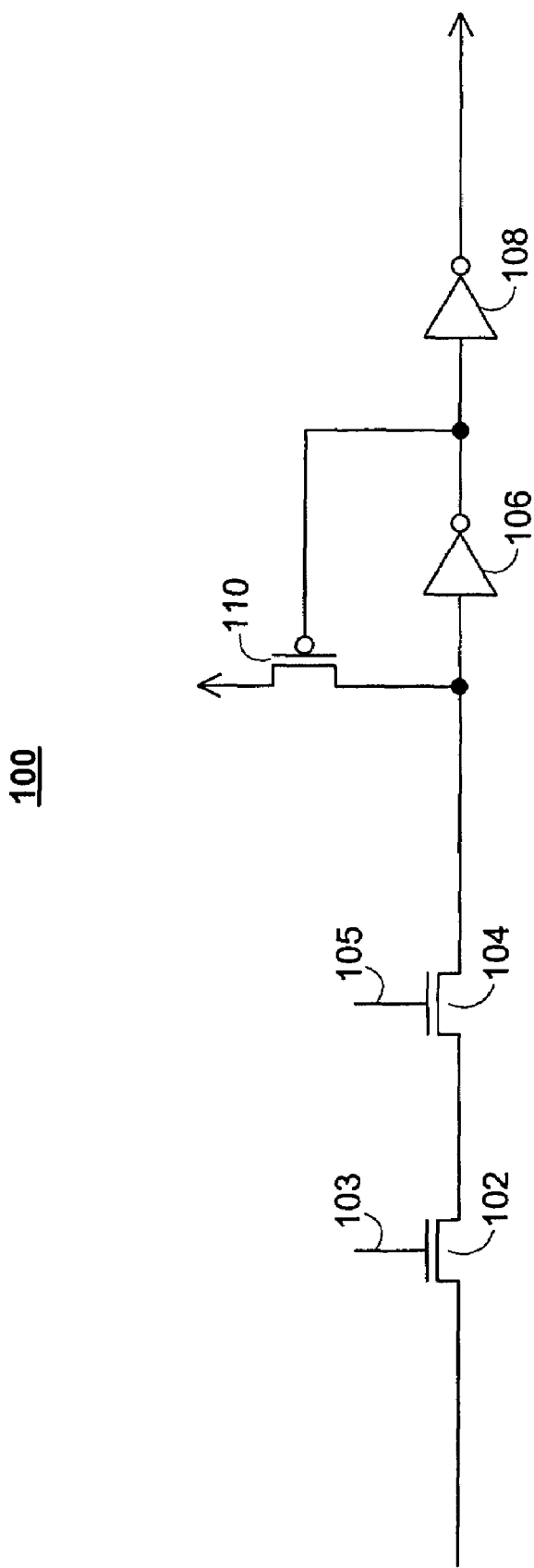
FIG. 1 is an illustration of a typical buffer circuit.

FIG. 1 illustrates typical buffer circuit 100. Buffer circuit 100 contains two NMOS passgates 102 and 104, two inverters 106 and 108, and a level-restoring half-latch 110. NMOS passgates 102 and 104 are switched on and off with control inputs 103 and 105, respectively. When a high logic input signal is applied to control inputs 103 and 105, NMOS passgates 102 and 104 pass an input signal through inverters 106 and 108 to the output of buffer circuit 100.

Typical NMOS passgates 102 and 104 may not pass the full voltage level of a high logic input signal. NMOS passgates 102 and 104 typically reduce the voltage of a high logic input signal by approximately $V_{TN}$, the threshold voltage of the passgates. As a result, a "weak" high logic input signal is passed to the input of inverter 106. Level-restoring half-latch 110 may pull-up the input of inverter 106 from a "weak" high logic input signal to the full high logic voltage of $V_{CC}$. However, level-restoring half-latch 110 is only turned on after the "weak" high logic input signal has reached the trip point of inverter 106 and causes inverter 106 to output a low logic signal.

The "weak" high logic input signal may reduce the overall speed of buffer circuit 100. For example, when buffer circuit 100 is operated with a low voltage or during startup of the buffer circuit, a "weak" high logic input signal may reach the trip point of inverter 106 more slowly than a full voltage high logic signal. As a result of the "weak" high logic input received at inverter 106, the switching speed of inverter 106 and accordingly the overall speed of buffer circuit 100 may be reduced.

One solution to this problem is to replace passgates 102 and 104 with low $V_T$ passgates. Low $V_T$ passgates may increase the speed of buffer circuit 100 by passing higher voltage signals. However, at least one drawback of using low $V_T$ passgates in buffer circuit 100 is that low $V_T$ passgates increase leakage currents. Increased leakage currents increase, in turn, the power consumption of the buffer circuit. Accordingly, even when the passgates are off and the buffer is in standby or is disabled, leakage currents may pass through the low $V_T$ pass-gates.

Figure 2:
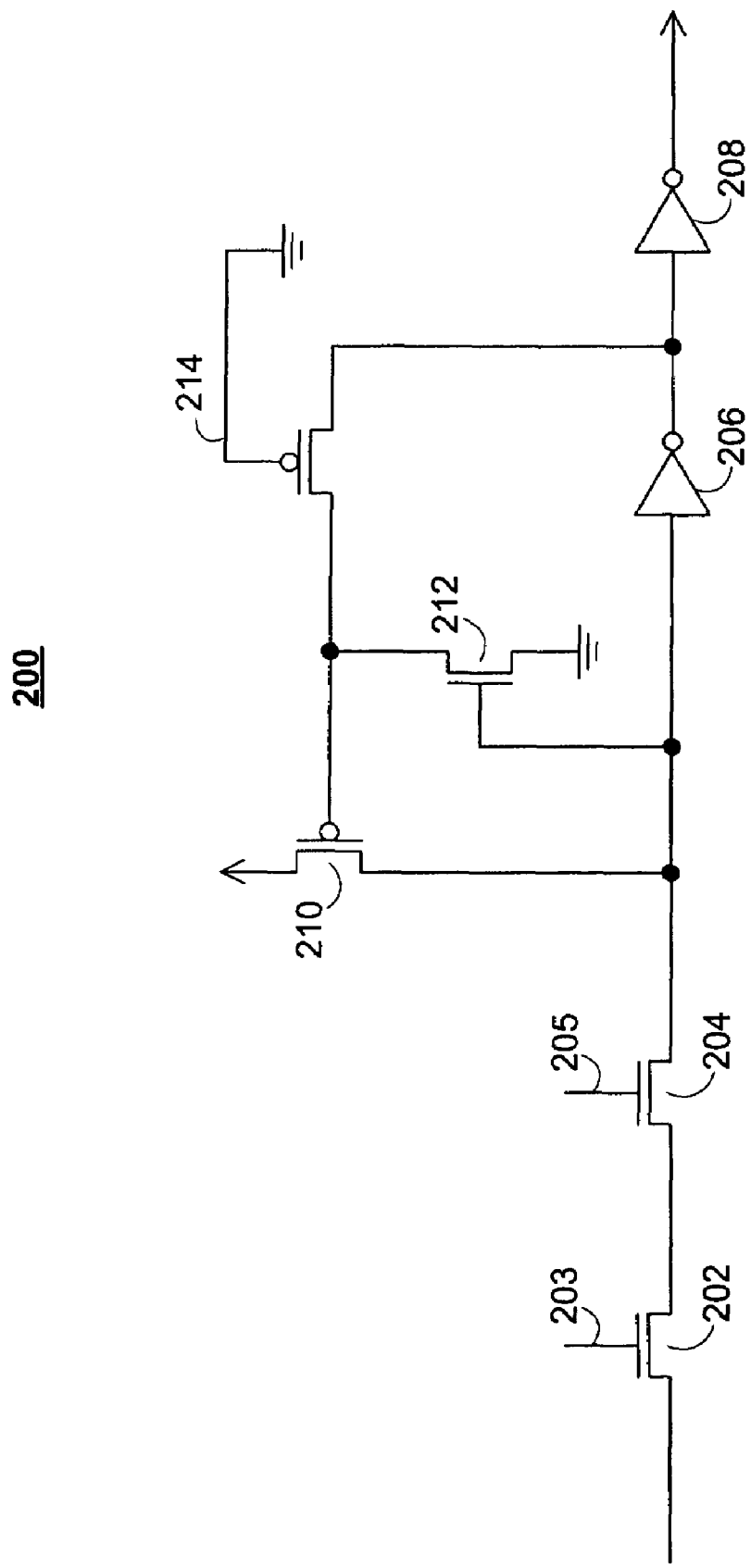
FIG. 2 is an illustration of a buffer circuit in accordance with one embodiment of the invention.

FIG. 2 illustrates buffer circuit 200 in accordance with one aspect of the present invention. Buffer circuit 200 may allow faster switching than typical buffer circuit 100 without significantly increasing leakage currents and power consumption. Buffer circuit 200 contains two NMOS passgates 202 and 204, two inverters 206 and 208, and a level-restoring half-latch 210, which all operate the same or similarly to their counterparts in buffer circuit 100. Buffer circuit 200 also contains low $V_T$ pulldown NMOS 212 and isolating PMOS 214.

Low $V_T$ pulldown NMOS 212 may increase the switching speed of buffer circuit 200 by turning on level-restoring half-latch 210 when a "weak" high logic input is received at inverter 206. NMOS 212 has a low $V_T$ NMOS, allowing it to switch on quickly, even in response to a "weak" high logic signal. This ensures that the input signal reaches the trip point of inverter 206. Thus in contrast to buffer circuit 100, level-restoring half-latch 210 may be turned on before the "weak" high logic signal reaches the trip point of inverter 206, and may quickly pull up the input signal past the trip point.

Isolating PMOS 214 may turn on and off to isolate low $V_T$ NMOS 212 from the output of inverter 206. When a high logic signal is input to buffer circuit 200, low $V_T$ NMOS 212 is turned on and is isolated from the output of inverter 206 by isolating PMOS 214. When a low logic signal is input to buffer circuit 200, low $V_T$ NMOS 212 is turned off and the high logic signal output of inverter 206 is passed through isolating PMOS 214, which may turn off level-restoring half-latch 210.

Buffer circuit 200, including low $V_T$ pulldown NMOS 212 and isolating PMOS 214, may allow inverter 206 to switch more quickly. This increases the overall speed of buffer circuit 200. While low $V_T$ pulldown NMOS 212 may introduce a leakage current into the buffer, the relatively small sized transistor should not significantly increase the power consumption of buffer circuit 200. Further, low $V_T$ pulldown NMOS 212 and isolating PMOS 214 allow passgates 202 and 204 to have a standard or even increased $V_T$, that may reduce their leakage current and power consumption without significantly affecting the speed of buffer circuit 200.

Figure 3:
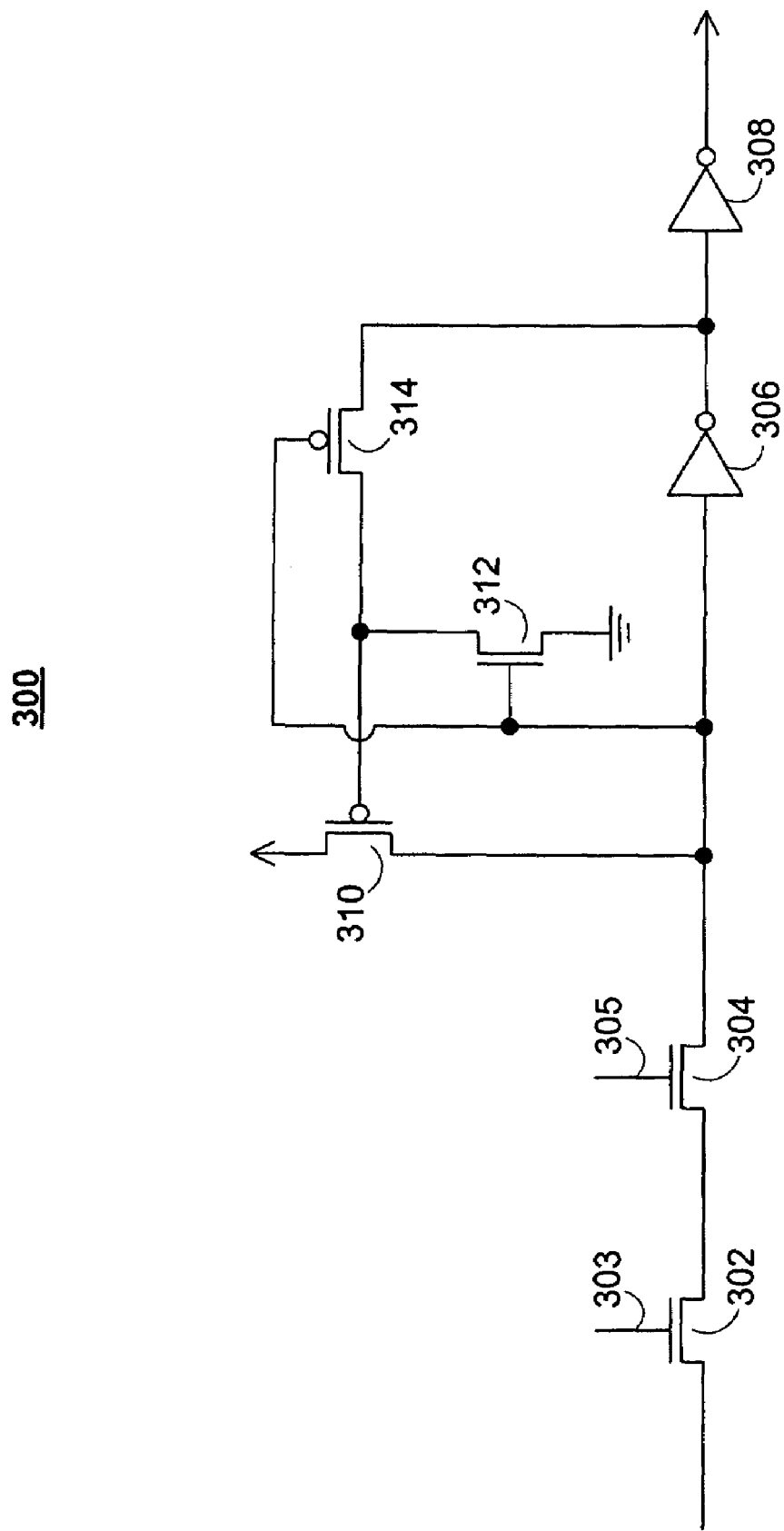
FIG. 3 is an illustration of a buffer circuit in accordance with another embodiment of the invention.

FIG. 3 illustrates buffer circuit 300 in accordance with one aspect of the present invention. Buffer circuit 300 contains the same or similar elements as buffer circuit 200, except that the gate of isolating PMOS 314 is connected to the input of inverter 306 instead of to ground. Because of this, isolating PMOS 314 may turn off in response to the voltage level of the input of inverter 306. In contrast, isolating PMOS 214 may only turn off in response to the voltage level of the output of inverter 206. Thus, buffer circuit 300 operates in a similar manner as buffer circuit 200, except isolating PMOS 314 may turn off faster in response to a high logic signal. This may further increase the speed with which level-restoring half-latch 310 is turned on and may further increase the speed of buffer circuit 300.

Figure 4:
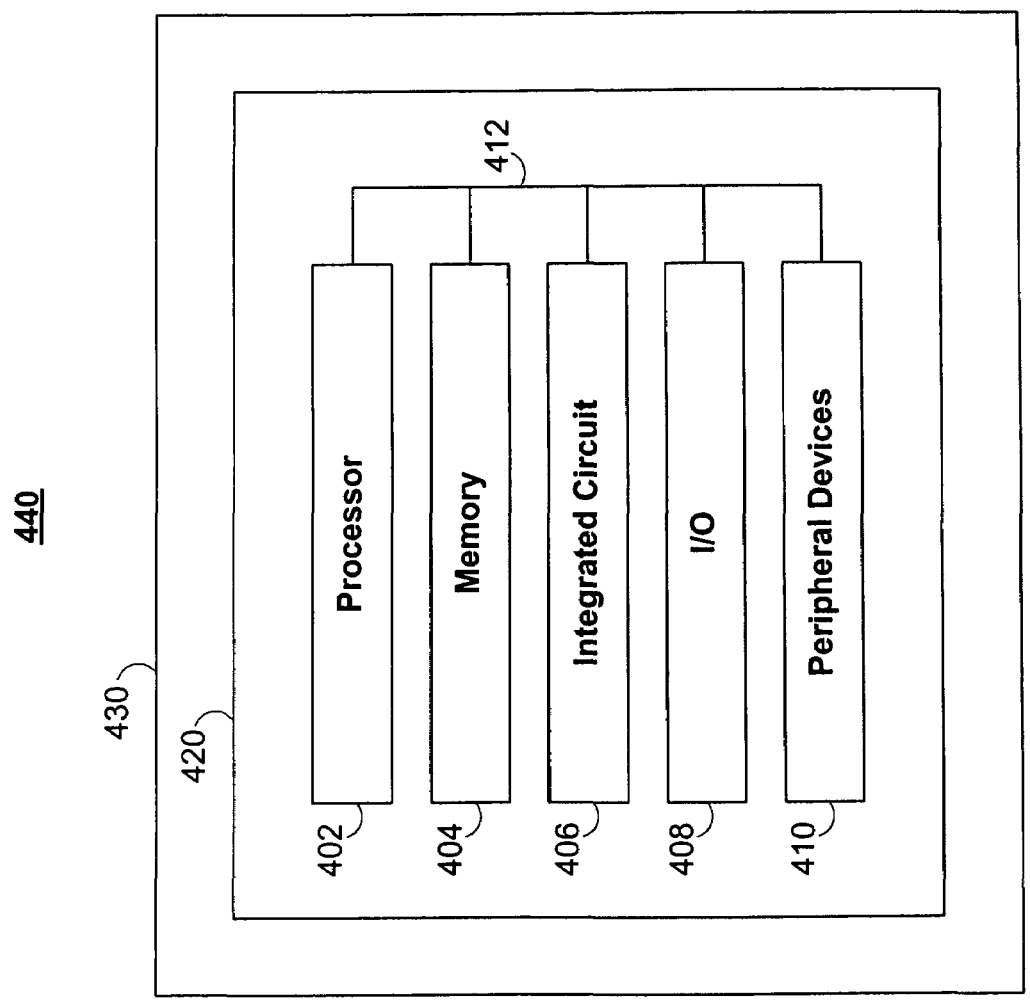
FIG. 4 is an illustration of an integrated circuit which incorporates the buffer circuit of this invention.

FIG. 4 illustrates an integrated circuit (IC) 406, which incorporates the buffer circuit of this invention, in a data processing system 440. Data processing system 440 may include one or more of the following components: processor 402; memory 404; I/O circuitry 408; and peripheral devices 410. These components are coupled together by a system bus 412 and are populated on a circuit board 420 which is contained in an end-user system 430.

System 440 can be used in a wide variety of applications, such as computer networking, data networking, instrumentation, video processing, or digital signal processing. IC 406 can be used to perform a variety of different logic functions. For example, IC 406 can be configured as a processor or controller that works in cooperation with processor 402. IC 406 may be a programmable logic device. IC 406 may also be used as an arbiter for arbitrating access to a shared resource in system 440. In yet another example, IC 406 can be configured as an interface between processor 402 and one of the other components in system 440.

Thus it is seen that circuits and methods are provided for a low-power low-voltage VCC buffer with a half-latch. One skilled in the art will appreciate that the invention can be practiced by other than the described embodiments, which are presented for purposes of illustration and not of limitation, and the present invention is limited only by the claims which follow.

What is claimed is:

1. Buffer circuitry comprising:
   a passgate having an input operative to receive a buffer input signal, an output, and a passgate control signal;
   a first inverter having an input coupled to said passgate output and an output;
   a second inverter having an input coupled to said first inverter output and an output operative to output a buffer output signal;
   a first transistor having a source directly coupled to a high voltage source, a drain directly coupled to the input of the first inverter, and a gate;
   a second transistor having a source directly coupled to a low voltage source, a drain directly coupled to the gate of the first transistor, and a gate directly coupled to the first inverter input; and
   a third transistor having a source directly coupled to the gate of the first transistor and the drain of the second transistor, a drain directly coupled to the first inverter output, and a gate.

2. The buffer circuitry of claim 1 wherein the passgate comprises an NMOS passgate.

3. The buffer circuitry of claim 2 wherein the NMOS passgate passes a reduced voltage level high input signal.

4. The buffer circuitry of claim 1 wherein the first transistor comprises a PMOS transistor.

5. The buffer circuitry of claim 1 wherein the second transistor comprises an NMOS transistor.

6. The buffer circuitry of claim 1 wherein the third transistor comprises a PMOS transistor.

7. A digital processing system comprising:
   processing circuitry;
   a memory coupled to said processing circuitry; and
   buffer circuitry as defined in claim 1 coupled to the processing circuitry and the memory.

8. The digital processing system of claim 7 wherein the processing circuitry comprises a PLD.

9. A printed circuit board on which is mounted buffer circuitry as defined in claim 1.

10. The printed circuit board defined in claim 9 further comprising:
    a memory mounted on the printed circuit board and coupled to the buffer circuitry.

11. The printed circuit board defined in claim 9 further comprising:
    processing circuitry mounted on the printed circuit board and coupled to the buffer circuitry.

12. The buffer circuitry of claim 1 wherein the gate of the third transistor is directly coupled to a low voltage source.

13. The buffer circuitry of claim 1 wherein the gate of the third transistor is directly coupled to a the first inverter input signal.

14. The buffer circuitry of claim 1 wherein the passgate is operative to couple the passgate input to the passage output in response to the passgate control signal and independent of the buffer input signal.

15. The buffer circuitry of claim 1 wherein the first transistor is operative to couple the input of the first inverter to the high voltage source.

16. The buffer circuitry of claim 1 wherein the second transistor is operative to couple the gate of the first transistor to the low voltage source in response to a voltage level of the first inverter input.

17. The buffer circuitry of claim 1 wherein the third transistor is operative to isolate the first inverter output from the gate of the first transistor and the drain of the second transistor.

* * * * *